US009076729B2

(12) United States Patent
Ting et al.

(10) Patent No.: US 9,076,729 B2
(45) Date of Patent: Jul. 7, 2015

(54) METHOD OF FORMING INTERCONNECTION STRUCTURE HAVING NOTCHES FOR SEMICONDUCTOR DEVICE

(71) Applicant: Taiwan Semiconductor Manufacturing Company, Ltd., Hsin-Chu (TW)

(72) Inventors: Chih-Yuan Ting, Taipei (TW); Chung-Wen Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 13/936,942

(22) Filed: Jul. 8, 2013

(65) Prior Publication Data

US 2014/0264873 A1 Sep. 18, 2014

Related U.S. Application Data

(60) Provisional application No. 61/778,799, filed on Mar. 13, 2013.

(51) Int. Cl.
*H01L 23/48* (2006.01)
*H01L 21/283* (2006.01)

(52) U.S. Cl.
CPC .................................... *H01L 21/283* (2013.01)

(58) Field of Classification Search
CPC ...................................................... H01L 23/481
USPC .......... 257/751, 773, 774, E23.141, E23.146; 438/618
See application file for complete search history.

(56) References Cited

U.S. PATENT DOCUMENTS

| | | | | |
|---|---|---|---|---|
| 2005/0106919 A1* | 5/2005 | Layadi et al. | ................. | 439/290 |
| 2006/0022341 A1* | 2/2006 | Sir et al. | ......................... | 257/758 |
| 2008/0087998 A1* | 4/2008 | Kamins et al. | ................ | 257/686 |
| 2008/0303156 A1* | 12/2008 | Kim | .............................. | 257/754 |
| 2010/0084770 A1* | 4/2010 | Sakuma et al. | ............... | 257/774 |

* cited by examiner

*Primary Examiner* — Matthew Gordon
(74) *Attorney, Agent, or Firm* — Haynes and Boone, LLP

(57) ABSTRACT

A semiconductor device is disclosed. The device includes a substrate, a first dielectric layer disposed over the substrate and a metal structure disposed in the first dielectric layer and below a surface of the first dielectric layer. The metal structure has a such shape that having an upper portion with a first width and a lower portion with a second width. The second width is substantially larger than the first width. The semiconductor device also includes a sub-structure of a second dielectric positioned between the upper portion of the metal structure and the first dielectric layer.

20 Claims, 10 Drawing Sheets

200
714
712
710
700
645
650
416
640
$h_2$
412
414
$h_1$
310
214
210
$w_2$
$w_1$

200

210

214

METHOD OF FORMING INTERCONNECTION STRUCTURE HAVING NOTCHES FOR SEMICONDUCTOR DEVICE

This application claims priority to U.S. Provisional Patent Application Ser. No. 61/778,799, filed on Mar. 13, 2013, the entire disclosure of which is hereby incorporated herein by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, interconnects of conductive lines and associated dielectric materials that facilitate wiring between the transistors and other devices play a more and more important role in IC performance improvement. It is desired that metallization for interconnection structures be robust, and improvements in this area are needed.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
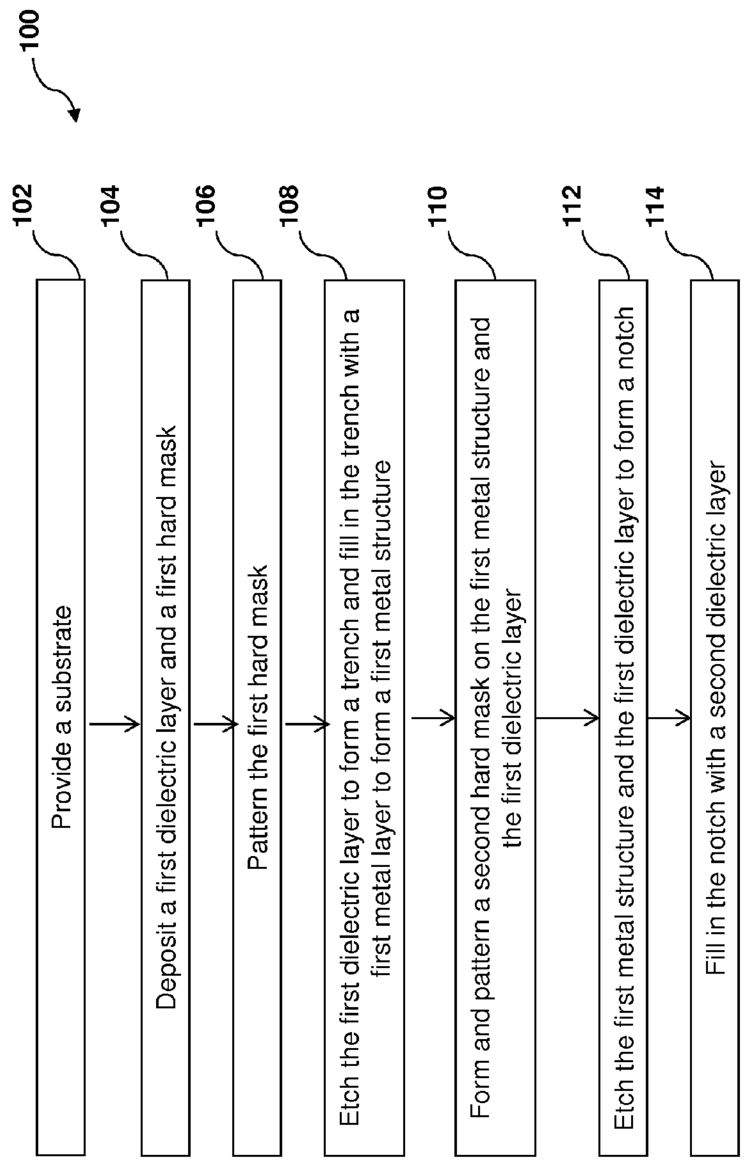
FIG. 1 is a flowchart of an example method for fabricating a semiconductor integrated circuit (IC) constructed according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 9B for the sake of example.

Figures 2, 3:
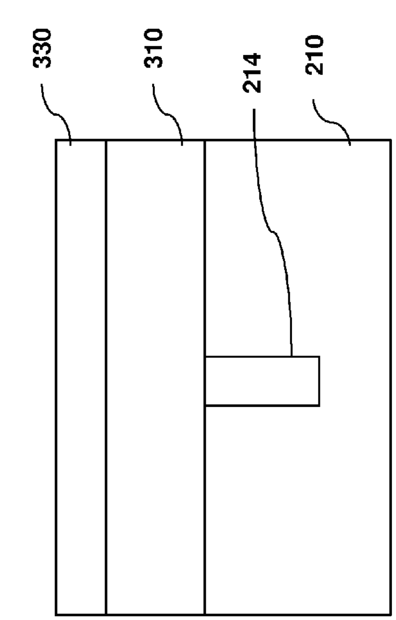
FIGS. 2 to 9B are cross-sectional views of an example semiconductor IC device at fabrication stages constructed according to the method of FIG. 1.

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The substrate 210 also includes conductive features, represented by conductive features 214 in FIG. 2. The conductive features 214 may include doped regions (such as sources or drains), or gate electrodes. Alternatively, the conductive features 214 may include electrodes, capacitors, resistors or a portion of resistors. The conductive features 214 may also include a portion of the interconnect structures, such as contacts, metal vias, or metal lines. The conductive features 214 may be formed by a procedure including lithography, etch and deposition.

Referring to FIGS. 1 and 3, the method 100 proceeds to step 104 by depositing a first dielectric layer 310 over the substrate 210 and a first hard mask 330 over the first dielectric layer 310. The first dielectric layer 310 includes dielectric materials, such as silicon oxide, silicon nitride, a dielectric material having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, amorphous fluorinated carbon, Parylene, BCB (bis-benzocyclobutenes), polyimide, and/or other materials as examples. In another example, the low k dielectric material may include an extreme low k dielectric material (ELK). A process of forming the dielectric material layer 310 may utilize spin-on coating or CVD.

The first hard mask 330 may include materials having a substantially slow etch rate compared to the first dielectric layer 310 in a later etching process. For example, the first hard mask includes silicon nitride, silicon oxide, silicon oxynitride, or other suitable material. In one embodiment, a first capping layer is interposed between the first dielectric layer 310 and the first hard mask 330. The first capping layer may include silicon carbide, silicon carbide nitride, silicon nitride, carbon doped oxide dielectrics comprised of Si, C, O, and H (SiCOH), or other suitable materials. The first hard mask layer 330, as well as the first capping layer may be deposited by ALD, CVD or PVD process.

Figure 4:
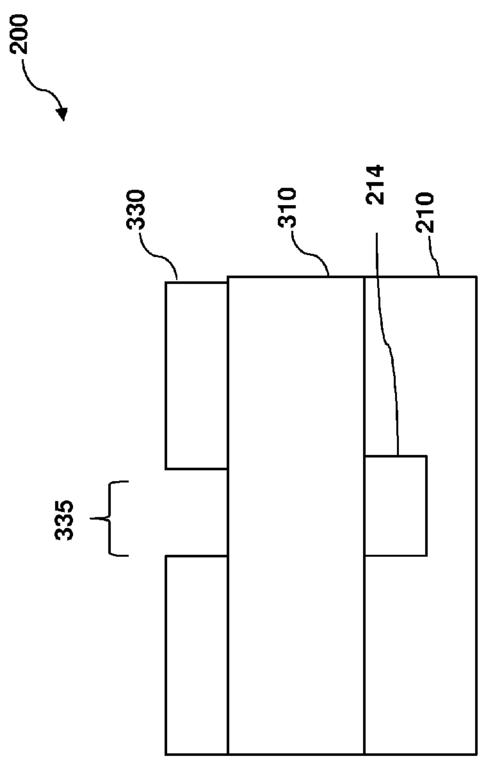

Referring to FIGS. 1 and 4, the method 100 proceeds to step 106 by patterning the first hard mask 330. The first hard mask 330 may be patterned by lithography and etch processes. For example, a patterned photoresist may be formed on the first hard mask 330 by lithography processes and an etch process may follow to etch the first hard mask 330 through the patterned photoresist to form an opening 335 on the first hard mask. The opening 335 may be aligned to the respective conductive features 214 to define a vertical interconnection (to be formed). Alternatively or additionally, the opening 335 may also be aligned to an area where the conductive features 214 are absent to define a horizontal interconnection.

Figure 5:
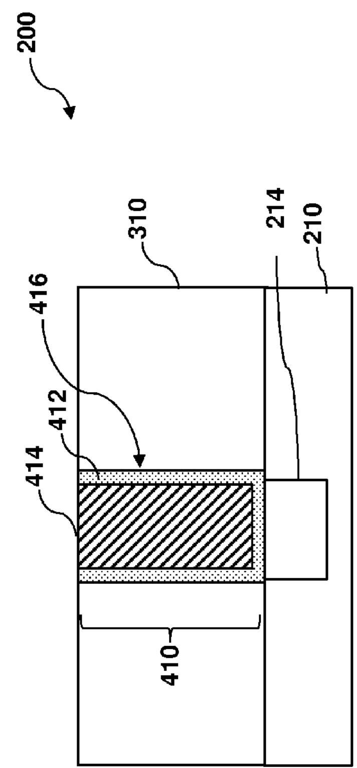

Referring to FIGS. 1 and 5, the method 100 proceeds to step 108 by forming a trench 410 in the first dielectric layer 310 and filling the trench 410 with a first metal layer 414 to form a first metal structure 416. The trench 410 is formed by etching the first dielectric layer 310 through the patterned first hard mask 330. The etch process includes wet etch, dry etch, or a combination thereof. In the present embodiment, the trench 410 is formed with a substantially straight sidewall profile.

In one embodiment, a first barrier layer 412 is filled in the trench 410 first to prevent diffusion and/or provide material adhesion. The first barrier layer 412 may include titanium nitride (TiN), tantalum nitride (TaN), tungsten nitride (WN), titanium silicon nitride (TiSiN), tantalum silicon nitride (TaSiN), or other suitable materials. The first metal layer 414 is then deposited on the first barrier layer 412. The first metal layer 414 may include aluminum (Al), copper (Cu) or tungsten (W) or other suitable conductive material. The first barrier layer 412 and the first metal layer 414 may be deposited by ALD, PVD, CVD, or other suitable process. With the substantially straight sidewall profile of the trench 410, a process window of metal layers filling in can be much more relaxed.

In the depicted embodiment, the metal layer 414 may exceed the first metal structure 416. Excess portions of the first metal layer 414, as well as the first barrier layer 412, may be removed by a chemical mechanical polishing (CMP) process. Additionally, the patterned first hard mask 330 and the first capping layer 320 are removed during the recess.

Figure 6A:
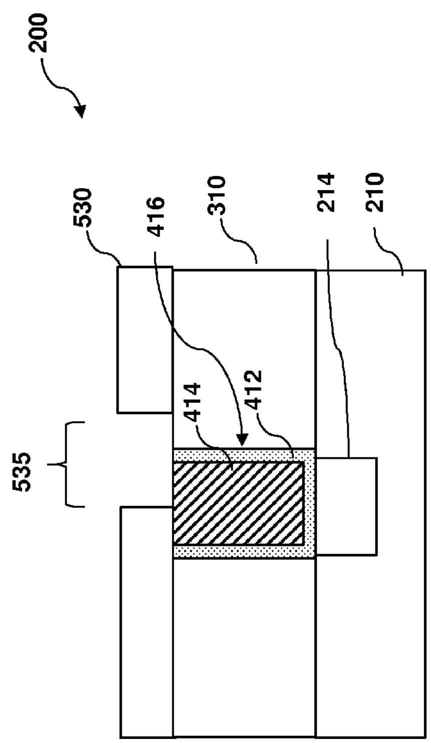
Figure 6B:
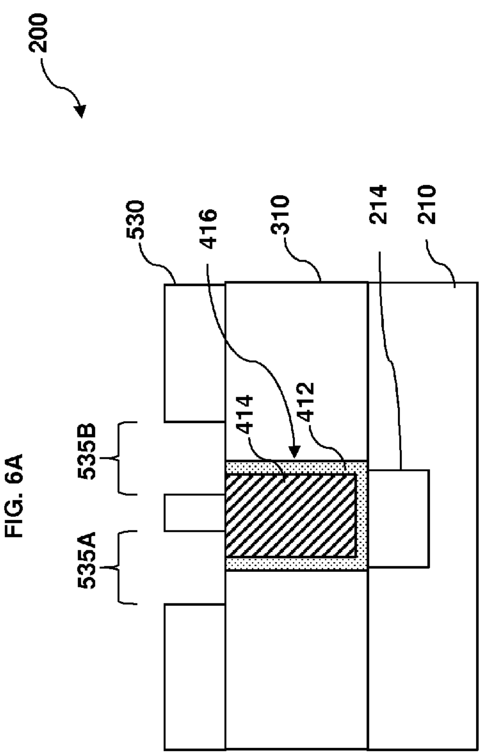

Referring to FIGS. 1, 6A and 6B, the method 100 proceeds to step 110 by depositing and then patterning a second hard mask 530 on the first metal structure 416 and the first dielectric layer 310. In one embodiment, a second capping layer is interposed between the first metal structure 416 and the dielectric layer 310 and the second hard mask 530. The second capping layer may be similar in many respects to the first capping layer discussed above. The second hard mask 530 includes materials which have a substantially slow etch rate comparing to etch rates of the first metal structure 416 and the first dielectric layer 310 in a later etching process. For example, the second hard mask 530 includes silicon carbide, silicon carbide nitride, silicon nitride, carbon doped oxide dielectrics comprised of Si, C, O, and H (SiCOH), or other suitable materials. The second hard mask 530 may be deposited by ALD, CVD, or other suitable processes. A procedure of patterning the second hard mask 530 is similar in many respects to patterning the first hard mask 330 discussed above in FIG. 4.

In the present embodiment, an opening 535 is formed in the patterned second hard mask 530, and is offset-aligned to one side of the first metal structure 416, as shown in the FIG. 6A. The opening 535 extends from the portion of the first metal structure 416 to adjacent first dielectric layer 310. Alternatively, two offset openings 535 are aligned to each side of the first metal structure 416, as shown in FIG. 6B. For the sake of reference, the two offset openings are assigned reference numbers 535A and 535B. Openings 535A and 535B extend to respective adjacent first dielectric layer 310. In the present embodiment, the opening 535A is separated with the opening 535B.

Figure 7A:
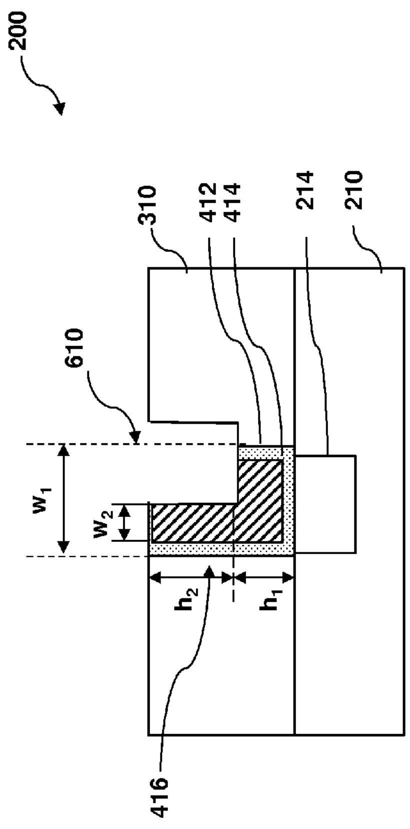
Figure 7B:
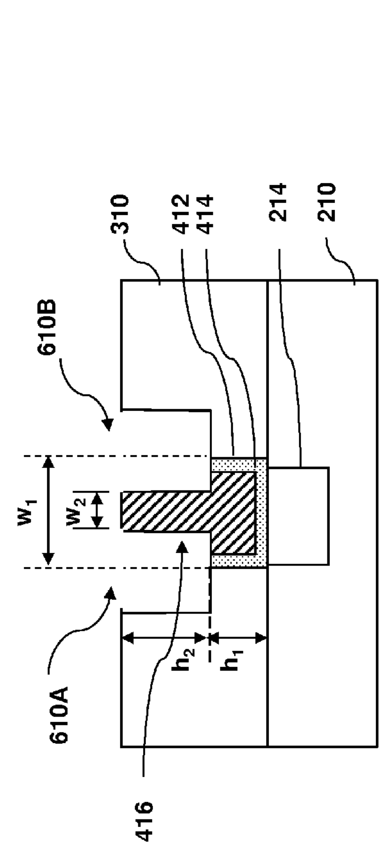

Referring to FIGS. 1, 7A and 7B, the method 100 proceeds to step 112 by etching a portion of the first metal structure 416 and the first dielectric layer 310 through the opening 535 to form a notch 610. The notch 610 defines the first metal structure 416 as a two-portion structure, which has a lower portion having the first width $w_1$ and a first height $h_1$, and an upper portion having a second width $w_2$ and a second height $h_2$. The second width $w_2$ is substantially smaller than the first width $w_1$. Alternatively notches 610 are formed on each side of the first metal structure 416 through openings 535A and 535B, and they are referred to as 610A and 610B.

Figure 7C:
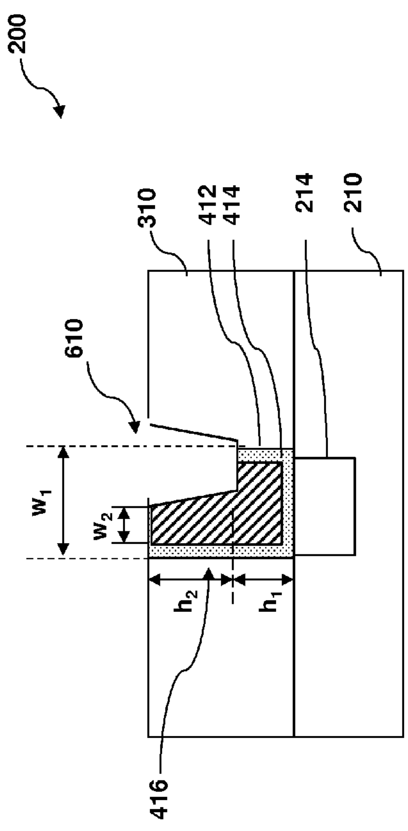
Figure 7D:
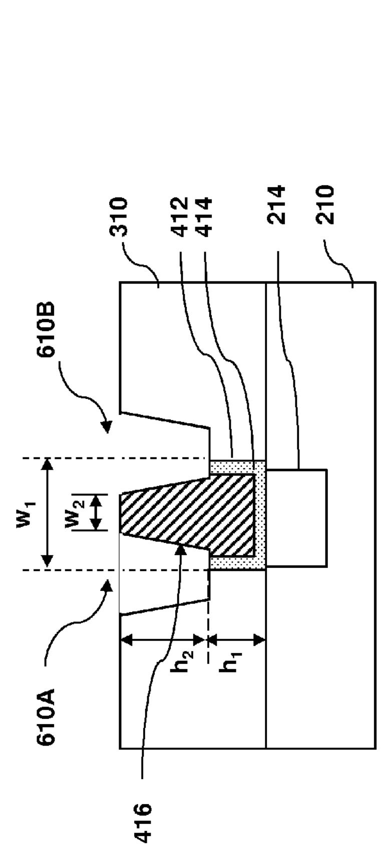

The etching process may include wet etch, dry etch, or a combination thereof. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile. In one embodiment, the notch 610 is formed with a vertical sidewall profile, as shown in FIGS. 7A and 7B. In another embodiment, the notch 610 is formed with a taper sidewall profile, having a wider top opening, as shown in FIGS. 7C and 7D.

Figure 7E:
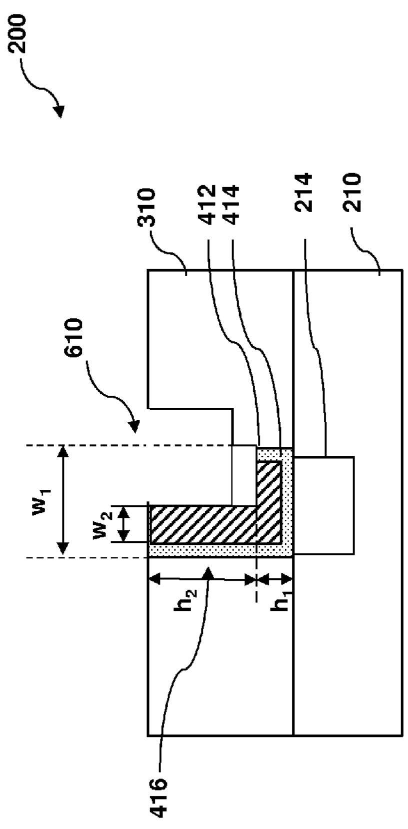
Figure 7F:
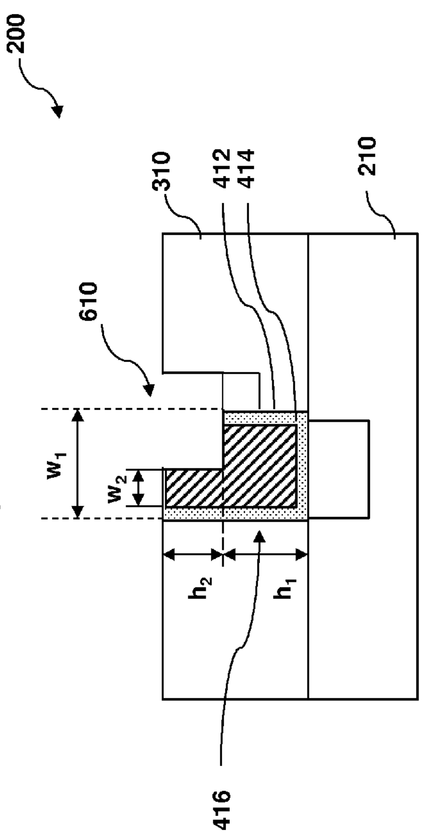

In one embodiment, the portion of the first metal structure 416 and the first dielectric layer 310 are etched simultaneously and by adjusting an etch rate ratio of the first metal structure 416 to the first dielectric layer 310, the notch 610 can be formed in various bottom profiles. For example, when the etch rate of the first metal structure 416 is controlled to be substantially larger than the etch rate of the first dielectric layer 310, the notch 610 is formed a non-flat bottom profile having a deeper portion in a side of the first metal structure 416, as shown in FIG. 7E. For another example, when the etch rate of the first metal structure 416 is controlled to be substantially slower than the etch rate of the first dielectric layer 310, the bottom profile of the notch 610 has a deeper portion at a side of the first dielectric layer 310, as shown in FIG. 7F. The etch rate ratio may be controlled by adjusting etching process parameters, such as etchants used, pressure, power, RF bias voltage, etchant flow rate, and other suitable parameters.

Figure 8A:
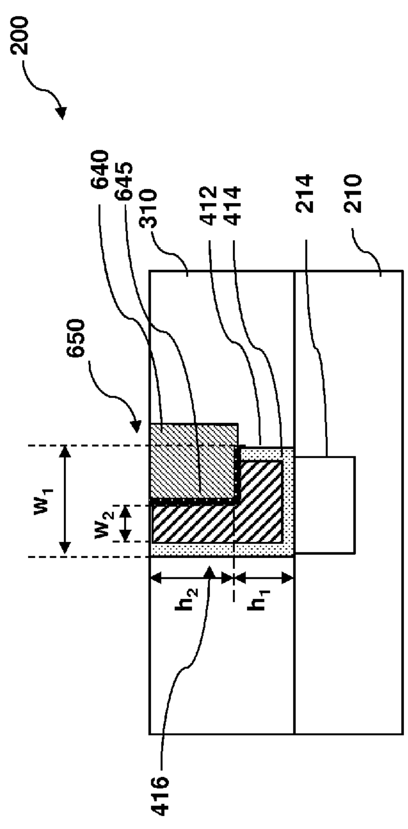
Figure 8B:
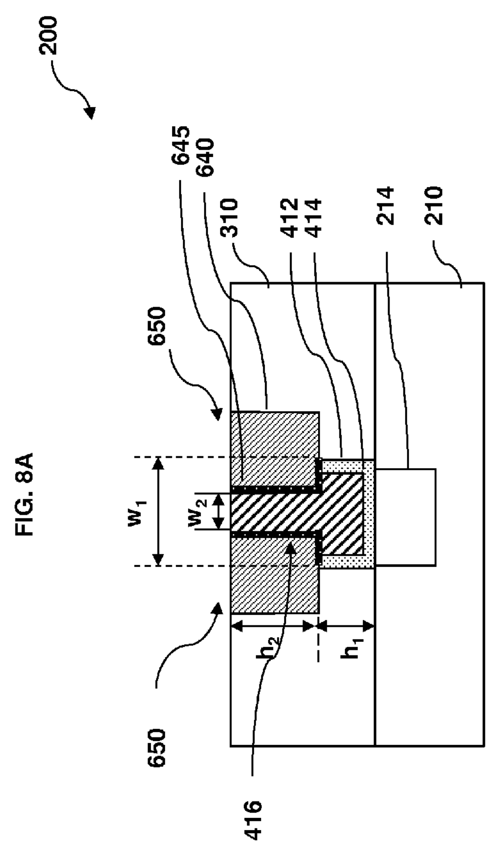

Referring to FIGS. 1, 8A to 8B, the method 100 proceeds to step 114 by filling in the notch 610 with a second dielectric layer 640 to form a dielectric sub-structure 650. The second dielectric layer 640 includes silicon carbide, silicon carbide nitride, silicon nitride, SiCOH, or other suitable materials. In one embodiment, the second dielectric layer 640 is formed with a material different from the first dielectric layer 310. The second dielectric layer 640 may be deposited by ALD, CVD and other suitable processes. In one embodiment, a second barrier layer 645 is deposited selectively on the first metal structure 416 in the notch 610 first and the second dielectric layer 640 is deposited on the second barrier layer 645 and fills in the notch 610. The second barrier layer 645 may prevent diffusion and/or improve adhesion between the first metal structure 416 and the second dielectric layer 640. The second barrier layer 645 includes metals, such as cobalt (Co), and may be deposited by ALD or CVD. Additionally, a CMP process is applied to remove excessive the second dielectric layer 640.

With the dielectric sub-structure 650, the first metal structured 416 is configured with a lower portion and an upper portion. In the present embodiment, the lower portion is referred to as a trench metal and the upper portion as avia metal of an interconnection. The second width $w_2$ is a critical dimension (CD) of the via metal. In one embodiment, a ratio of $h_2$ to $h_1$ is in a range from 0.25 to 4.0. Since both trench metal and via metal are formed by one metal layer, the first metal layer 414, the via metal is formed with a pseudo-self-alignment nature to the trench metal. In one embodiment, with the tapered notch 610, the via metal is formed with a taper sidewall profile having a smaller dimension at its top portion comparing to its bottom portion. In another embodiment, with a flat bottom profile of the notch 610, the trench metal has a flat bottom profile. In yet another embodiment, with a non-flat bottom profile of the notch 610, the trench metal has a non-flat bottom profile.

Figure 9A:
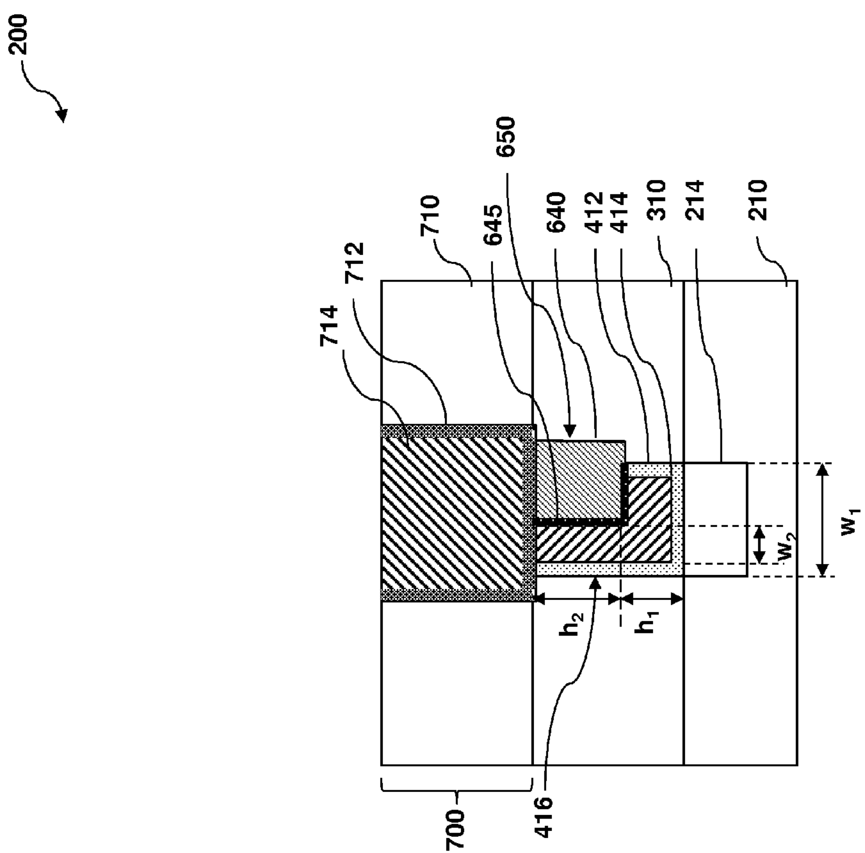
Figure 9B:
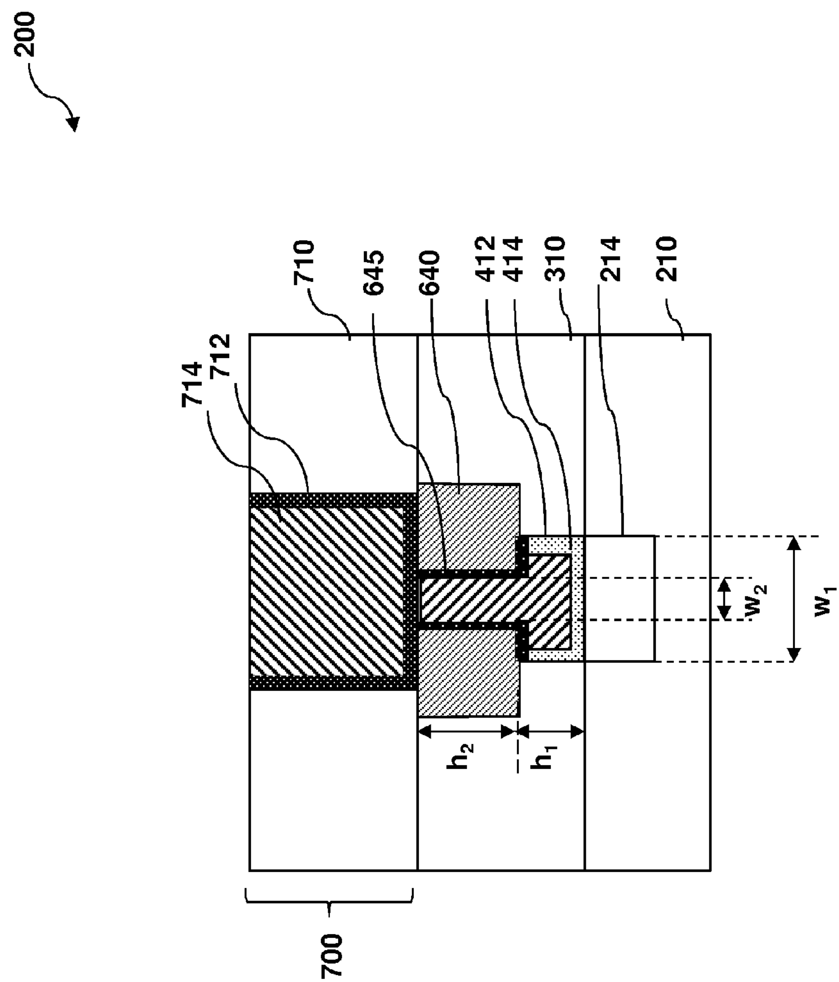

Additional steps can be provided before, during, and after the method 100, and some of the steps described can be repeated, replaced, eliminated, or moved around for additional embodiments of the method 100. As an example, the steps 104 to 108 are repeated to form a new metal/dielectric interconnection 700 over the first metal structure 416. The new metal/dielectric interconnection 700 may include a third dielectric layer 710, a third barrier layer 712 and a second metal layer 714, as shown in FIGS. 9A and 9B. The second metal layer 714, as well as the third barrier layer 712, may align and contact to a respective via metal of the first metal structure 416 to form a vertical interconnection.

Based on the above, the present disclosure offers a semiconductor device with a metal structure notched by a dielectric sub-structure. An upper portion of the metal structure serves as a via metal and a lower portion of the metal structure serves as a trench metal. The disclosure offers methods for forming the via metal and the trench metal. The method employs forming a dielectric sub-structure by etching portions of the metal structure and portions of a dielectric layer. The method provides forming the via metal with a self-alignment nature to align to the trench metal. The method has demonstrated a robust metal line formation for interconnection structures.

The present disclosure provides many different embodiments of a semiconductor device. The semiconductor device includes a substrate, a first dielectric layer disposed over the substrate and a metal structure disposed in the first dielectric layer and below a surface of the first dielectric layer. The metal structure has a such shape that having an upper portion with a first width and a lower portion with a second width. The second width is substantially larger than the first width. The semiconductor device also includes a sub-structure of a second dielectric positioned between the upper portion of the metal structure and the first dielectric layer.

In another embodiment, the present disclosure offers a method for fabricating a semiconductor device that provides one or more improvements over other existing approaches. In one embodiment, a method for fabricating a semiconductor device includes providing a substrate, forming a first dielectric layer over the substrate, forming a first trench in the first dielectric layer, filling in the first trench with a first metal layer to form a metal structure with a first width, forming a notch in the metal structure and the first dielectric layer, wherein the notch defines an upper portion with a second width and a lower portion with the first width of the metal structure and filling in the notch with a second dielectric layer.

In yet another embodiment, a method for fabricating a semiconductor device includes providing a substrate, depositing a first dielectric layer over the substrate, forming a patterned first hard mask over the first dielectric layer, etching the first dielectric layer through the patterned first hard mask to form a first trench, filling in the first trench with a first metal layer to form a metal structure, forming a patterned second hard mask over the metal structure and the first dielectric layer and removing a portion of the metal structure and a portion of the first dielectric layer to form a notch. The notch defines an upper portion and lower portion of the metal structure. A width of the upper portion is smaller than a width of the lower portion. The method also includes filling in the notch with a second dielectric layer, depositing a third dielectric layer over the metal structure, forming a second trench in the third dielectric layer to expose at least a portion of the upper portion of the metal structure and filling in the second trench with a second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:

depositing a first dielectric layer over a substrate;

forming a first trench in the first dielectric layer;

filling in the first trench with a first metal layer to form a metal structure with a first width;

forming a notch in the metal structure and the first dielectric layer, wherein the notch defines an upper portion with a second width and a lower portion with the first width of the metal structure;

filling in the notch with a second dielectric layer; and after filling in the notch with the second dielectric layer, forming a conductive feature over the metal structure and the second dielectric layer in the notch such that the conductive feature physically contacts the metal structure and the second dielectric layer in the notch.

2. The method of claim 1, wherein the second width of the upper portion of the metal structure is smaller than the first width of the lower portion of the metal structure.

3. The method of claim 1, wherein the notch is formed by etching the metal structure and the first dielectric layer through a patterned first hard mask simultaneously.

4. The method of claim 1, further comprising:

filling in the first trench with a first barrier layer prior to filling in the first metal layer; and selectively depositing a second barrier layer on the metal structure in the notch, prior to filling in the second dielectric layer.

5. The method of claim 4, wherein the second barrier layer includes cobalt (Co).

6. The method of claim 1, further comprising:

depositing a third dielectric layer over the metal structure; and forming a second trench in the third dielectric layer to expose at least a portion of the upper portion of the metal structure, and wherein forming the conductive feature over the metal structure and the second dielectric layer in the notch includes filling in the second trench with a second metal layer.

7. A method of forming a structure of a semiconductor device, the method comprising:

depositing a first dielectric layer over a substrate;

forming a patterned first hard mask over the first dielectric layer;

etching the first dielectric layer through the patterned first hard mask to form a first trench;

filling in the first trench with a first metal layer to form a metal structure;

forming a patterned second hard mask over the metal structure and the first dielectric layer;

removing a portion of the metal structure and a portion of the first dielectric layer to form a notch, wherein the notch defines an upper portion and lower portion of the metal structure, further wherein a width of the upper portion is smaller than a width of the lower portion;

filling in the notch with a second dielectric layer;

depositing a third dielectric layer over the metal structure;

forming a second trench in the third dielectric layer to expose at least a portion of the upper portion of the metal structure; and filling in the second trench with a second metal layer, wherein the second metal layer covers the second dielectric layer.

8. The method of claim 3, further comprising:

filling in the first trench with a first barrier layer prior to filling in the first metal layer;

selectively depositing a second barrier layer on the metal structure in the notch, prior to filling in the second dielectric layer; and filling in the second trench with a third barrier layer prior to filling in the second metal layer.

9. The method of claim 8, wherein the second barrier layer includes cobalt (Co).

10. A method of forming a structure of a semiconductor device, the method comprising:

depositing a first dielectric layer over a substrate;

forming a metal structure in the first dielectric layer and below a surface of the first dielectric layer, the metal structure having a shape that includes:

an upper portion with a first width; and a lower portion with a second width, which is substantially larger than the first width, whereby a notch is formed in the metal structure; and depositing a second dielectric sub-structure in the notch between the upper portion of the metal structure and the first dielectric layer; and after depositing a second dielectric sub-structure in the notch, forming a conductive feature over the metal structure and the second dielectric sub-structure in the notch such that the conductive feature physically contacts the metal structure and the second dielectric sub-structure in the notch.

11. The method of claim 10, wherein the second dielectric sub-structure includes a flat bottom profile.

12. The method of claim 10, wherein the second dielectric sub-structure includes a non-flat bottom profile.

13. The method of claim 12, wherein the second dielectric sub-structure has a deeper portion adjacent a side of the metal structure.

14. The method of claim 12, wherein the second dielectric sub-structure has a deeper portion on a side of the first dielectric layer.

15. The method of claim 10, wherein the metal structure has a relatively straight sidewall, except where notched by the second dielectric sub-structure.

16. The method of claim 15, wherein the metal structure is notched on one side by the second dielectric sub-structure.

17. The method of claim 15, wherein the metal structure is notched on two sides by the second dielectric sub-structures.

18. The method of claim 10, wherein the upper portion of the first metal structure has a taper sidewall profile, with a top width which is smaller than a bottom width.

19. The method of claim 10, further comprising:

a first barrier layer disposed between the metal structure and the first dielectric layer; and a second barrier layer disposed between the metal structure and the second dielectric sub-structure.

20. The method of claim 19, wherein the second barrier layer includes cobalt (Co) deposited selectively on the metal structure.

* * * * *